United States Patent [19]

Mombrun et al.

[11] Patent Number: 4,983,224

[45] Date of Patent: Jan. 8, 1991

[54] CLEANING COMPOSITIONS AND METHODS FOR REMOVING SOLDERING FLUX

[75] Inventors: Suzette L. Mombrun, Sunnyvale; Rudolf P. Sedlak, Palo Alto, both of Calif.

[73] Assignee: RD Chemical Company, Mountain View, Calif.

[21] Appl. No.: 263,731

[22] Filed: Oct. 28, 1988

[51] Int. Cl.$^5$ .................. B08B 3/08; C23G 5/024; C11D 3/18; C11D 3/20

[52] U.S. Cl. ....................................... 134/40; 134/42; 252/170; 252/171

[58] Field of Search .................. 134/26, 40, 42; 252/170, 171

[56] References Cited

U.S. PATENT DOCUMENTS

| 4,276,186 | 6/1981 | Bakos et al. | |
|---|---|---|---|
| 4,640,719 | 2/1987 | Hayes et al. | 134/42 |
| 4,740,247 | 4/1988 | Hayes et al. | 134/18 |
| 4,867,800 | 9/1989 | Dishart et al. | 134/40 |

OTHER PUBLICATIONS

"The Printed Circuit Handbook", Koombs, C. F. Editor., pp. 16-2 to 16-13.
Barnier, *Kester Solder Company*, "Flux and Solder Controls for High Speed Printed Circuit Board Soldering", Litton Systems, Chicago, Ill.
Barnier, *Kester Solder Company Publication*, "Activation Temperature for Fluexs", Litton Systems, Chicago, Ill.
Barnier, *Kester Solder Company*, "The Advantages in Using Bi-Polar Solvents un the Removal of Resin Fluxes", Litton Systems, Chicago, Ill.
Barnier, *Kester Solder Company*, "Residues? Solvents? and Other Questions about Vapor Degreasing of PC Boards", Litton Systems, Chicago, Ill.
Barnier, *Kester Solder Company*, "Removing Organic Flux Residue", Litton Systems, Chicago, Ill.
Barnier, *Kester Solder Company*, "Soldering Fluxes", Litton Systems, Chicago, Ill.
Casperson, *Zenith Radio Corporation Publication*, "The Nature of Residues Being Presented to the Cleaning Machine", Glenview, Ill.
Liyanage, *PC FAB*, (Oct. 1987), pp. 61–69.
Slepping, *PC FAB*, (Dec. 1987), pp. 56–57.
Truck, *Circuits Manufacturing*, (Aug. 1988), pp. 48–52.
Woodgate, Electronic Packaging and Production (Jan. 1988), pp. 109–110.

*Primary Examiner*—Patrick P. Garvin
*Assistant Examiner*—George R. Fourson
*Attorney, Agent, or Firm*—Irell & Manella

[57] ABSTRACT

A method to remove solder flux residues from assembled or partially assembled electronic circuit boards employs a composition containing a nonpolar component consisting essentially of terpenes and/or terpenols, a polar component consisting essentially of a polar aprotic solvent or a mixture of polar aprotic solvents, and a surfactant. Use of this composition results in shorter cleaning times at lower temperatures with superior results.

6 Claims, No Drawings

4,983,224

CLEANING COMPOSITIONS AND METHODS FOR REMOVING SOLDERING FLUX

TECHNICAL FIELD

The invention relates to electronic circuit board manufacturing, and to those steps in the procedure which follow soldering of components. In particular, the invention concerns methods to clean soldering flux from assembled or partially assembled circuit boards.

BACKGROUND ART

The manufacturing and assembly of electronic circuit boards is a complex and multistep process resulting in products of considerable and well-known utility. In general, a circuit is superimposed on a metal surface by patterning areas of conductivity and resistance. This is done using a suitable photoresist coating as protection and etching unprotected areas. The resultant is a set of metal layers on the board. As part of this process, in addition, certain features of this process involve procedures which utilize protection of areas, which are not to be affected, using adhesive tape. After completion of these processes, the tape is removed, and the adhesive cleansed from the board. The adhesives subject to cleaning are generally silicone or vinyl polymers.

After the unassembled boards have been fabricated, the components which will serve as gates, resistors, capacitors, etc. are soldered to the fabricated board. The soldering process, which results in a board assembled with its components, uses fluxes to insure good bonding between the metal of the fabricated board and the metal contact of the component through the interdigitation of the solder into each metal surface. To achieve this, the solder must be capable of wetting the surface and there can be no impurities impeding the integration. The flux, therefore, is used to degrease and decontaminate the surface to allow free access of the solder. Finally, the remainder of the flux must be cleansed from the assembled board.

The invention provides a superior composition for removing the flux residues in an efficient and thorough manner. The composition contains, in admixture, a terpene or terpenol, a surfactant, and an aprotic polar organic solvent. The admixture may be dispersed in water for use, depending on the nature of the flux to be removed.

Compositions of these substances have been sold for removal of adhesive residues at the above-mentioned, different, earlier stage of the process. However, the chemical and physical nature of the tape residues are very different from the flux compositions, and as far as Applicants are aware, these compositions have not heretofore been used for flux removal.

The fluxes which are subject to removal by the compositions of the invention are those customarily used in circuit board manufacture. These are of two major types: synthetic water soluble and rosin-containing fluxes. Rosin is a by-product of the distillation of pine tree sap and contains about 90% rosin acids and 10% neutral material, both of which are basically tricyclic isoprenoid condensates. In the operation of this flux, the rosin acids react with the surface metal oxide layer and do not attack the freshly exposed metal. The rosin-containing fluxes may also be activated using organic amines, acids, amides or halogen-containing materials and are thus used to produce rosin mildly activated (RMA) or rosin-activated (RA) fluxes. Most of the activating substances, apparently, decompose to liberate hydrochloric acid so that metal chloride salts formed from reaction with the clean metal surface become suspended in the flux.

The synthetic or water-soluble fluxes are also used in soldering electronics assemblies; the active components are usually amine hydrochlorides or hydrobromides along with water-soluble organic acids. These activators are dissolved in a solvent such as a glycol ether, alcohol, or their blends with water. Occasionally these fluxes can be washed away simply by using water; however, because they are so reactive, their use in electronics components may be disadvantageous. These fluxes can also be cleaned away usefully using the compositions of the invention, as their water solubility often is not maintained during the soldering process; while some of the residues remain water-soluble, others are not. For example, decomposition products caused by heating of the organic materials are often insoluble, and the chlorides of certain metals, for example lead chloride, may be tightly bonded to the substrate. Therefore, simple rinsing with water is often inadequate to remove the putatively "water-soluble" residues generated from these fluxes.

There is no dearth of compositions which have been tried for solder flux removal in the electronic board manufacturing process. For example, U.S. Pat. No. 4,640,719 describes compositions with a minimum of 60% terpene with the balance of the composition being a surfactant. A typical composition illustrated as the most preferred embodiment contains 90% limonene, and the 10% detergent component composed of 6.5% poly(7)ethoxynonyl phenol; 2.1% poly(10)ethoxynonyl phenol, and 1.4% sodium dioctyl sulfosuccinate. This composition is asserted to be capable of removing adhesives as well as flux; however, no data are given to support this asserted property.

U.S. Pat. No. 4,276,186 to Bakos et al describes a composition of at least 50% by weight of N-methyl-2-pyrrolidone and at least 5% by weight of a water-miscible alkanolamine, with the balance of 0–35% of a nonpolar hydrocarbon or halogenated hydrocarbon solvent. This composition is said to be useful in cleaning solder flux or flux residues from substrates. The cleaning process evidently is advanced by relatively high temperatures.

The *Printed Circuits Handbook* Koombs, C. F. ed., on pages 16-2 to 16-13 describes methods and compositions used for cleaning soldered circuit boards and freeing them of flux residues. This description shows the effect of various single component solvents such as perchloroethylene and various fluorocarbons to dissolve fluxes. Other alternatives include saponification of the acidic components in rosin-based solvents, and the use of water, although in large quantities with incomplete results, to remove the residues of putatively water-soluble fluxes.

DISCLOSURE OF THE INVENTION

The invention provides a composition which is capable of removing residues of a variety of soldering fluxes with surprising efficiency and convenience. Furthermore, the materials used in the composition are relatively environmentally safe as compared to the chloroflurocarbons. The proportions of materials in the composition are adjustable according to the substrate flux; however, the composition itself, which can, when in use, be mixed with water or not, is of the following components: 25-90% terpene and/or terpenol; 1-10% surfactant; and the remainder, or 5-65%, of a polar aprotic solvent. As the terpene or terpenol is the least polar component, its proportion will be varied according to the polarity of the residue; the major portion of the offset of the proportion of terpene component lies in the amount of the polar aprotic solvent.

Therefore, the invention is directed to a method to remove soldering flux residues from assembled or partially assembled circuit boards by contacting the circuit board to be cleaned with the composition of the invention for a time period effective to solubilize or mobilize the flux residue, followed by removal of the cleaning composition.

MODES OF CARRYING OUT THE INVENTION

The compositions of the invention are useful for cleaning the residues of fluxes from assembled or partially assembled electronic circuit boards. The fluxes generally utilized leave residues which include terpene-derived acids and other tricyclics, and degradation products thereof, from rosin-based fluxes, and end products of the various organic monomers used in synthetic fluxes, as well as insoluble or complexed salts of inorganic ions from the synthetic flux type. The residues therefore differ in mechanical and chemical character from the tape residues encountered at earlier stages of manufacture. The tape residues are generally polymeric, nonaromatic adhesives such as polyvinyl or polyacrylic structures of high molecular weight, and silicone. The adhesive residues are problems for the fabricators of the bare board without components; the flux residues which are the targets of the method of the invention are on assembled or partially assembled boards wherein components have been soldered to the basic board, and thus are problems for assemblers.

The compositions have three major components. A major portion of the composition—25-90%, and preferably, in most cases, 50-80%—is terpene and/or terpenol or mixture of either or both which contributes a nonpolar character to the composition. This element of the composition is essential because of nonpolar components occurring in the flux residues. This is particularly true of residues of rosin-based fluxes, since these are themselves terpenoid by-products. As used herein, "terpene" refers to a polyunsaturated oligomer of isoprene units and includes such representative examples as limonene and pinene. "Terpenols" refers to the hydration products of the terpenes, which contain one or more alcohol functional groups resulting from the addition of water to one or more of the double bonds contained in the terpenes. Of course, mixtures of the terpenes and terpenols are satisfactory and, in fact, may be more economically convenient than purified single components. These materials can be obtained from the distillate of pine oil or of the oils extracted from citrus fruit. The optimal percentage of the terpene or terpenol components depends on the composition of the residue—the more polar the residue, the lower the percentage of terpene or terpenol desirable in the cleaning composition.

There is a variable range of desirable compositions depending on the nature of the flux residue, although the generally described composition is satisfactory for a wide range of flux residue targets. A high percentage of abietic acid, pimeric acid, or dehydroabietic acid as would be contributed by rosin in the flux is better removed by compositions containing higher amounts of terpenes and/or terpenols in the cleaning composition. On the other hand, organic water-soluble fluxes which contain, at least initially, water-soluble organic compounds, especially hydrohalide salts such as hydrobromides and hydrochlorides, require less terpene or terpenol in the cleaning composition. (Entirely inorganic fluxes such as zinc chloride are generally not used in electronics assembly; therefore, the requirements for cleaning of these fluxes are not considered here.)

The second component of the composition is a polar aprotic solvent, such as dimethylsulfoxide (DMSO), dimethylformamide (DMF), N-methylpyrrolidone (NMP), butyl cellusolve or ethylene glycol monobutyl ether (BC), and tripropylene glycol monomethyl ether (TPGME). In general, low molecular weight forms of polyethylene glycol ethers are suitable in the composition. The amount of polar aprotic solvent is in the range of 5-65% and, like the percentage of terpene/terpenol, is a function of the nature of the flux residue—the more polar synthetic organic fluxes requiring a higher percentage of the solvent. In general, the terpene/terpenol component and polar aprotic solvent component are balanced to meet the particular requirements of the flux residue encountered.

The third component of the cleaning compositions of the invention is 1-10% surfactant. The percentage depends on ease of rinse desired. The nature of the surfactant depends on the ratio of nonpolar (terpene/terpenol) to polar (polar aprotic solvent) component. Mixtures of surfactants are generally used. Highly desirable surfactants include non-ionic surfactants such as the polyethoxylated alcohols, alkylphenols, and dialkylphenols, as well as anionic surfactants such as the aryl and alkyl sulfonates, carboxylates and phosphates. Cationic detergents are generally less preferred, because they typically are not as free rinsing as other classes. Amphoterics may be used but most commercially available amphoterics are too polar to provide satisfactory emulsification. These surfactants are designed to be used in shampoos or aqueous high salt compositions. Generally, the percentage of surfactant is less if an ionic surfactant is employed as these forms are more readily effective; higher percentages of the nonionic forms are forms are used. Particularly preferred as surfactants are ethoxylated nonyl phenols and high molecular weight sulfonates.

In carrying out the method of the invention, the cleaning composition described herein is used neat or is emulsified or otherwise mixed with water for application to the assembled or partially assembled circuit board. The composition can be applied in a dip tank, in a vat wherein agitation is provided, or the composition can be sprayed or brushed onto the board. Contact with the cleaning composition is maintained for a time sufficient to remove the flux residue, generally from 20 sec to 10 min, more typically 2-3 min, shorter times being required if agitation is provided, for example by stirring the composition or by ultrasonic agitation. The temperature of treatment is generally ambient temperature. Slightly elevated temperatures can also be used, but are not necessary.

When sufficient contact has been made with the circuit board to mobilize and detach the flux residue, the cleaning composition containing the residue is removed from contact with the board, which may optionally be further washed with water, with increasing dilutions of cleaning composition and water, and finally with water.

If desired, the cleaning composition can be reclaimed and reused in further operations, using generally accepted techniques.

The following examples are intended to illustrate but not to limit the invention.

EXAMPLE 1

Comparison of Various Polar Aprotic Solvents in Invention Compositions 15 1×2 inch coupons were cut from a board obtained from Advanced Circuit Services, and Kester 1429 flux (composition) was applied on half of one side of each coupon. 5 coupons were heavily coated and placed in a 300° F. oven for 5 min; 5 were lightly coated and placed in a 240° F. oven for 5 min, and the remaining 5 coated with a medium coating were allowed to dry at room temperature and dipped in molten solder.

After cooling to room temperature, each sample was cleaned with a composition containing 80% limonene, 6.5% poly(7)ethoxynonyl phenol, 2.1% poly(10)ethoxynonyl phenol, and 1.4% sodium dioctyl sulfosuccinate, plus 10% aprotic polar organic solvent. The control was the EC-1 described in U.S. Pat. No. 4,640,719, which is as described above except that the 10% polar aprotic organic solvent is replaced with an additional 10% of limonene. The cleaning compositions which contain solvent are dramatically more efficient in removing flux residue from these samples, as is shown in Table 1.

TABLE 1

| Organic Solvent | Time for Complete Removal | | |
|---|---|---|---|
| | Baked (300° C.) | Baked (240° C.) | Dipped |
| None (EC-1) | * | 20 sec | 20 min |
| NMP | 10 sec | 5 sec | 2 min |
| TPGME | 20 sec | 7 sec | 2 min, 20 sec |
| BC | 15 sec | 6 sec | 1 min |
| DMSO | 20 sec | 12 sec | 2 min, 20 sec |

*Within 2 min, most of the flux was removed. However, a heavy scum was left on the part. The parts removed from the other solutions had only a light film remaining.

An additional 5 coupons were heavily treated with Kester 1429 flux, allowed to dry at room temperature, and then dipped in molten solder so that the results shown in Table 1, column 3 were repeated but with a heavier coating of the flux. The results of this variation are shown in Table 2.

TABLE 2

| Solvent | Time for Complete Removal |
|---|---|
| None (EC-1) | Most removed in 2 min, however still incomplete after 15 min |
| NMP | 3 min, 30 sec (90% removed in 2 min) |
| TPGME | 5 min, 10 sec |
| BC | 3 min, 25 sec |
| DMSO | 4 min, 30 sec |

Following the same procedure for the dipped coupons, various fluxes were tested with the invention compositions and the time required for complete flux removal is shown in Table 3. The values are given in minutes (') and seconds (").

TABLE 3

| Kester # | Type | % Solids | EC-1 | NMP | BC | DMF |
|---|---|---|---|---|---|---|
| 1429 | SA | ? | 20' | 2' | 1' | 2' |
| 197 | RMA | 37 | 1',20" | 1',20" | 1',45" | 40" |
| 185 | RMA | 36 | 18" | 16" | 20" | 25" |
| 1544 | RA | 68 | 2' | 3' | 2',45" | 2',25" |
| 1585 | RA | 36 | 1-1.5' | 1-1.5' | 1-1.5' | 1-1.5' |
| 1588 | RA | 20 | 40",1' | 30",55" | 30" | 45" |
| 1515S | RA | 16 | 50",25" | 30" | 25" | 25" |
| 932-M1 | RMA | 13 | >13'* | 1',45" | 8'* | 2',20" |

*white residue remains

In these evaluations, substitution of the polar aprotic solvent for a portion of the limonene resulted in a more efficient cleaning of the board for some fluxes. The extent of improvement depends on the nature of the flux used and on the pretreatment of the coated coupon.

We claim:

1. A process for removing soldering flux residue from an assembled or partially assembled electronic circuit board, which process comprises:
    contacting said board with a cleaning composition which consists essentially of 25-90% terpene/terpenol; 1-10% surfactant; and 5-65% polar aprotic solvent; said composition optionally in admixture with water, for a time period effective to mobilize and detach said flux residue; and
    removing the cleaning composition and flux residue from contact with the circuit board.

2. The process of claim 1 wherein the polar aprotic solvent is selected from the group consisting of N-methyl pyrrolidone, tripropylene glycol monomethyl ether, ethylene glycol monobutyl ether, DMF and DMSO.

3. The process of claim 1 wherein the terpene/terpenol is selected from the group consisting of limonene, pinene, and mixtures thereof.

4. The process of claim 1 wherein the surfactant is a polyethoxylated alcohol or a mixture of polyethoxylated alcohols.

5. The process of claim 1 wherein the flux residue is a residue from a rosin-based flux and the cleaning composition contains 80-90% terpene/terpenol.

6. The process of claim 1 wherein the flux residue is deposited by a synthetic water-soluble flux and the cleaning composition contains 25-50% terpene/terpenol.

* * * * *